United States Patent [19]

Schnall et al.

[11] Patent Number: 4,742,304
[45] Date of Patent: May 3, 1988

[54] MULTIPLE TUNING NMR PROBE

[75] Inventors: Mitchell D. Schnall; John S. Leigh, Jr., both of Philadelphia; V. Harihara Subramanian, Upper Darby, all of Pa.

[73] Assignees: Phospho-Energetics, Inc.; Trustees of the Univ. of Pennsylvania, both of Philadelphia, Pa.

[21] Appl. No.: 858,741

[22] Filed: May 2, 1986

[51] Int. Cl.⁴ ............................................. G01R 33/20
[52] U.S. Cl. ..................................... 324/318; 324/322
[58] Field of Search ............... 324/318, 322, 311, 313, 324/57 Q, 57 SS

[56] References Cited

U.S. PATENT DOCUMENTS

| | | | |
|---|---|---|---|
| 1,227,114 | 5/1917 | Campbell | 324/57 Q |
| 2,661,459 | 12/1953 | Schmidt | 333/174 |
| 3,098,208 | 7/1963 | Winfield et al. | 334/64 |
| 3,234,477 | 2/1966 | Pearson | 330/4.9 |
| 3,434,043 | 3/1969 | Nelson | 324/310 |
| 3,771,055 | 11/1974 | Anderson | 324/322 |
| 3,858,112 | 12/1974 | Satoh et al. | 324/322 |
| 4,075,552 | 2/1978 | Traficante et al. | 324/322 |
| 4,408,162 | 10/1983 | Egger | 324/318 |
| 4,446,431 | 5/1984 | McKay | 324/322 |
| 4,450,408 | 5/1984 | Tiemann | 324/318 |

FOREIGN PATENT DOCUMENTS 166139 3/1985 Japan ................................. 324/313

OTHER PUBLICATIONS

Single Coil Probe w/TL Tuning for NMR Double Resonance V. R. Cross et al., Rev. Sci. Instrum., vol. 47, No. 12, Dec. 1976.

NMR Double Tuned Matching Boxes for Double Resonance FT Exp. on Hydrogen and Fluorine 6 Matson Journal of Mag. Resonance No. 3, Mar. 1977.

Primary Examiner—Michael J. Tokar
Assistant Examiner—Louis M. Arana
Attorney, Agent, or Firm—Browdy & Neimark

[57] ABSTRACT

A multiple tuning NMR probe includes a radio frequency (RF) probe tuned by means of a circuit which creates a multiple pole circuit response in the probe, each of the poles being sufficiently separated from each other as to cause resonance of the probe at distinct frequencies. When tuning for nuclei with resonances substantially apart, this function may be accomplished using a parallel capacitor-inductor (L-C) trap with an impedance matching network. When tuning for nuclei with substantially closely spaced resonances, a tank circuit is used which has a single resonance which is split into two resonances by strongly coupling it to another tank circuit in resonance with the sample coil tank circuit.

19 Claims, 5 Drawing Sheets

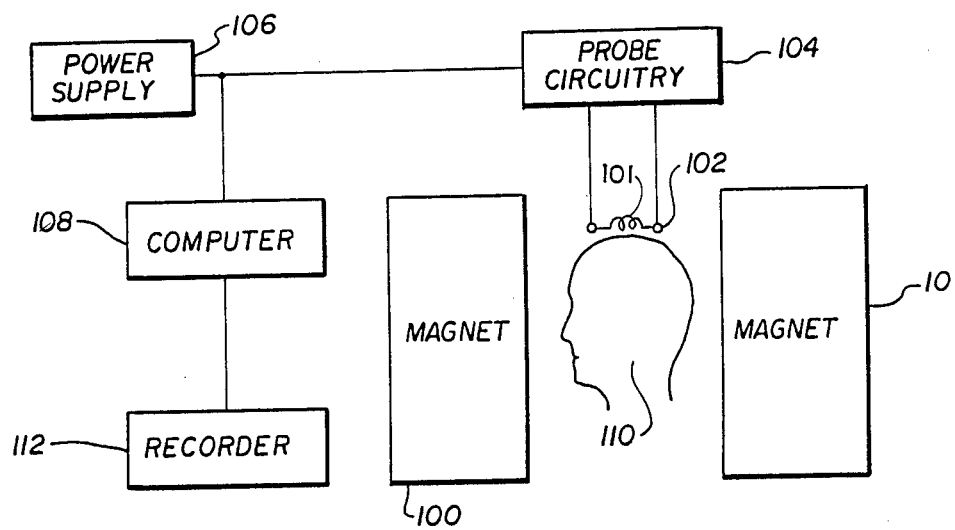
FIG.1
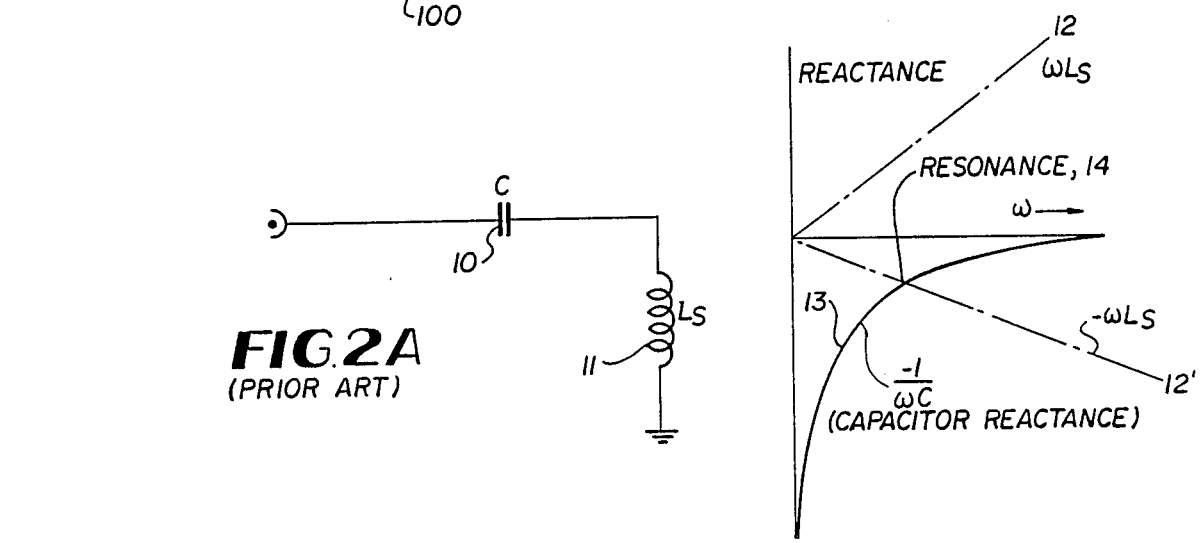
FIG.2A
(PRIOR ART)
FIG.2B
(PRIOR ART)
FIG.3A
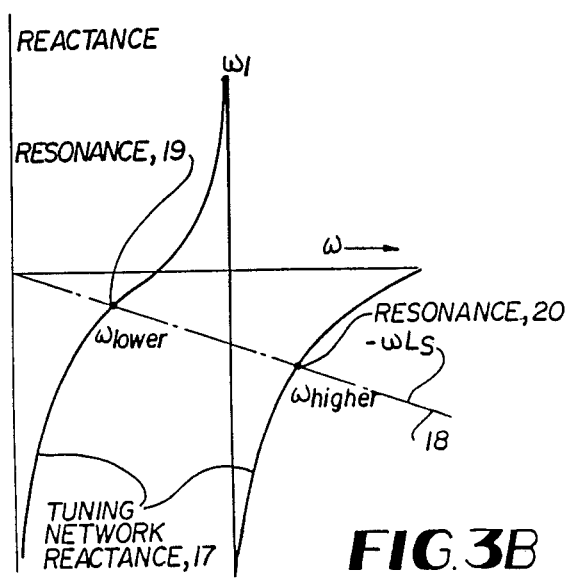
FIG.3B

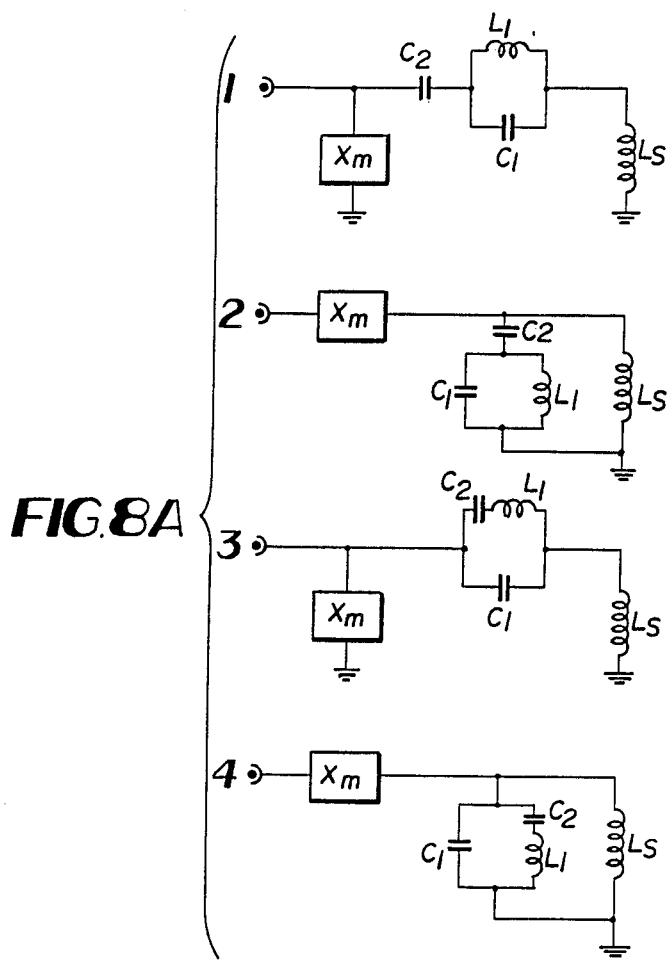
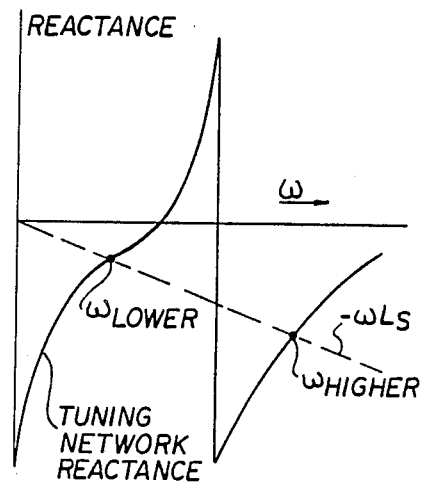
FIG.8A
FIG.8B
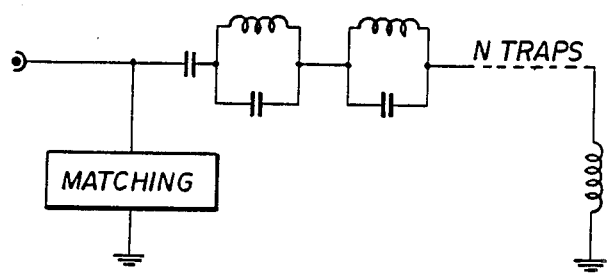
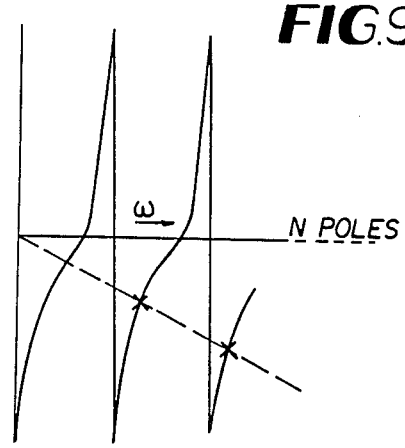
FIG.9A
FIG.9B

MULTIPLE TUNING NMR PROBE

FIELD OF THE INVENTION

The present invention relates to nuclear magnetic resonance (NMR) spectroscopy and more specifically to a multiple-tuning NMR probe for simultaneous study of different nuclei.

BACKGROUND OF THE INVENTION

Atomic nuclei possess spin angular momentum which is dependent upon the nuclear spin quantum number, I. Many nuclei have I=O and possess no angular momentum. This includes all nuclei with both an even atomic and an even mass number. NMR principles can be applied to liquid and solid media containing atoms whose nuclei have non-zero angular momentum (spin) to perform in vivo spectroscopy. Therefore, when a nuclear magnetic substance, such as water, is placed in a homogeneous static field (with a magnitude $H_0$), its resonance angular frequency $\omega 0$ is given by the equation:

$$\omega 0 = \gamma H_0.$$

where $\gamma$ is the nuclear gyromagnetic ratio of a measuring substance and is a natural constant Typically, in NMR spectroscopy, material being studied is subjected to both a static uniform magnetic field and a time varying radio frequency field. The result is the induction of nuclear magnetic resonance when the above-stated equation is satisfied. Thus, a particular nuclear magnetic resonance indicates the presence of selected nuclei in the sample.

The basic components of an NMR spectrometer are a magnet of very uniform field, a radio frequency (rf) source, for generating frequency through the range of all possible frequencies in the sample, and a detector of absorption of rf energy by the sample. Typically, the static magnetic field is produced by a suitable coil carrying a steady current, and in view of the magnitude of the magnetic field required, the coil may well be a superconducting coil, and the radio frequency field is produced by a supplementary coil or high frequency coil, supplied with high frequency current. Resonance is detected by a further or receiver coil surrounding the sample, or the supplementary coil can be time shared. The rf power from the transmitter is fed into the probe of the instrument. The probe is located in the magnet gap and houses the sample holder as well as the transmitter and receiver coils. The NMR signal is then detected by the receiver for further processes.

The atoms of a sample are excited when an rf pulse, with a frequency equal to the resonant frequency of those atoms, is transmitted to the sample coil. Pulsed NMR enables time resolved studies to be performed in vivo. During pulsed experiments, the NMR spectrometer is inactive most of the time, waiting for the spin system to relax before exciting it again.

In vivo NMR measurements from many different nuclei are now being used to study physiologic and medical problems (e.g., $^1H$, $^{19}F$, $^{31}P$, $^{23}Na$, $^7Li$, and $^{13}C$). Concurrent acquisition of in-vivo NMR data from more than one nucleus increases the information available from an experiment without requiring extra data collection time, while eliminating many of the problems of biological variability. The development of multinuclear probes capable of performing with high sensitivity is a prerequisite to collecting NMR data concurrently from any set of nuclei.

A major problem in implementing multinuclear NMR is the construction of a probe capable of operating at more than one NMR frequency. Several methods have been reported to double-tune NMR probes. These probes were primarily designed to provide a separate input to the coil at the second frequency for the purpose of decoupling. Modification of these circuits by tuning the inputs and connecting them to a single port provides a useful coil for two-nuclei NMR. A major problem with this approach is the large number of reactive elements needed to accomplish this which makes the probe very difficult and cumbersome to build.

SUMMARY OF THE INVENTION

Accordingly, it is an object of the present invention to provide a new multiple-tuning NMR probe for concurrent multinuclear resonance and detection in NMR spectroscopy and imaging.

It is a further object of the present invention to provide such a multiple-tuning NMR probe requiring very few components additional to those required in a single tuning probe.

It is another object of the present invention to provide such a multiple-tuning NMR probe in which all frequencies are generated and detected using a single input/output terminal.

It is yet another object of the present invention to provide such a multiple-tuning NMR probe in which the circuitry which permits the generation and detection of multiple frequencies is disposed externally of the transmitter/receiver circuitry, thereby permitting use of such a probe with existing NMR spectrometers.

It is still another object of the present invention to provide such a multiple-tuning NMR probe in which the multiple frequencies are generated by a tuning network which has multiple poles and thus will tune at every pole.

It is yet a further object of the present invention to provide such a multiple tuning NMR probe in which each of the multiple frequencies are substantially spaced from one another.

It is still a further object of the present invention to provide such a multiple tuning NMR probe in which at least two of the multiple frequencies are substantially closely spaced from one another without losing sensitivity.

These and other objects of the present invention are accomplished in the manner explained in detail later and shown in the drawings. In essence the RF probe is tuned by means of a circuit which creates a multiple pole circuit response in the probe, each of the poles being sufficiently separated from each other as to cause resonance of the probe at distinct frequencies. When tuning for nuclei with resonances substantially apart, this function may be accomplished using a parallel capacitor-inductor (L-C) trap with an impedance matching network. When tuning for nuclei with substantially closely spaced resonances, a tank circuit is used which has a single resonance which is split into two resonances by strongly coupling it to another tank circuit in resonance with the sample coil tank circuit.

BRIEF DESCRIPTION OF THE DRAWINGS

FIG. 1 illustrates a general schematic of an NMR spectrometer.

FIG. 2(A) shows the electrical circuit diagram for a prior art series capacitor tuned probe.

FIG. 2(B) is a graph plotting the reactance of the tuning network (capacitor in this case), along with the anti-reactance (dashed line), of the sample coil ($L_S$) as a function of frequency. The intersection of these two curves corresponds to resonance.

FIG. 3(A) shows the electrical circuit diagram for a tuning network consisting of a parallel LC trap in series with a capacitor for tuning a probe.

FIG. 3(B) illustrates the graphical analysis of this network. Note that two resonances are established. ($\omega_1$ is the reasonance of the parallel trap: $L_1$ and $C_1$).

FIG. 8(A) shows electrical circuit diagrams representing four complementary configurations all yielding the same reactance profile and thus similar resonance.

FIG. 8(B) illustrates the reactance curve for all of the configurations of FIG. 8(A).

FIG. 9(A) shows the electrical circuit diagram representing the extension of the tuning network of the present invention into an N-frequency tuning network.

FIG. 9(B) shows the reactance curve for the configuration of FIG. 9(A). For each additional trap another pole is added to the reactance resulting in another reasonance.

FIG. 14 illustrates other forms of coupled circuits that are useful to make NMR probes.

DETAILED DESCRIPTION OF THE INVENTION

Figure 4A:
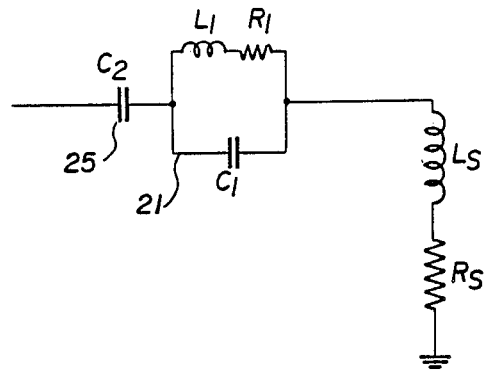
FIG. 4(A) shows the electrical circuit diagram of a double tuning circuit; $R_1$ and $R_S$ are the RF resistances ($Q/L\omega$) of the inductor ($L_1$) and sample coil respectively.

The NMR spectrometer of FIG. 1, as particularly set up for in vivo analysis, comprises a strong main magnet 100 and probe 101 including a sample (RF) coil 102 (such as a butterfly surface coil) and tuning circuitry 104. The probe 101 is connected to a computer 108 via radio frequency transmitter/receiver circuitry and A/D converter means, not shown, for processing the data received from the subject 110, positioned inside main magnet 100. As the tuning circuitry 104 is externally connected to the coil 102, the probe 101 can be used with any existing NMR spectrometer.

In general, two conditions should be met by an NMR probe to ensure optimal performance. First, it should reasonate at the desired frequency of operation; and, second, it should be impedance matched to the source impedance (usually a 50 ohm transmission line) to ensure maximum power transmission.

To create a resonant structure, the reactance of the probe must be eliminated to yield a purely real impedance. This condition will maximize the current flow in the coil and thus maximize the $B_1$ field that it creates. This will also optimize the probe performance as a receiver.

In practice, a resonant NMR coil can be created by adding a tuning circuit that will cancel out the complex part of the impedance of the coil. A method commonly used to accomplish this, for single tuned probes, is to add a capacitor 10 in series with the coil 11 (FIG. 2(A)), and tuning for the series reasonance. The capacitor 10 reactance is $-1/\omega C$ and the coil 11 reactance is $\omega L$; thus, at the frequency where the magnitude of the reactances are equal, the sum will be zero and a reasonance is established. The problem of finding the resonance condition is represented graphically in (FIG. 2(B)). If the negative of the reactance curve 12 (referred to as the antireactance 12') and the reactance curve 13 of the tuning network, in this example the capacitor 10, are drawn on the same plot, a the intersection 14 of the two curves a reasonance is accomplished.

In order to multiple-tune a probe, it is necessary to make the reactance curve of the tuning network cross the anti-reactance curve of the coil more than once.

A useful tuning network (FIG. 3(A)) is created by adding a parallel LC trap 15 in series with the simple tuning capacitor $C_2$. As shown in FIG. 3(B) the reactances 17 of this network will begin capacitive, then pass through a pole at the frequency corresponding to the parallel resonance of the trap 15, and become capacitive again. The reactance curve 17 will twice cross the anti-reactance curve 18 of the sample coil $L_s$ and thus result in two reasonances 19, 20.

Any time inductors are added to the probe circuitry, a certain amount of power loss can be expected to occur across the real resistance of the inductors. This will, to some extent, degrade the quality of the probe; but this degradation may not be reflected in the measured probe Q, defined as the ratio of energy stored in the probe to energy dissipated. This new method of double tuning a probe requires fewer inductors and should result in lower losses. It is still useful, however, to treat these losses in some detail.

Figure 4B:
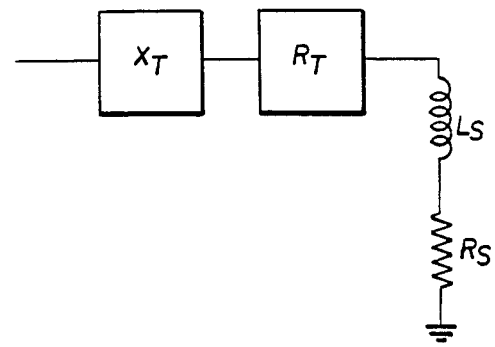
FIG. 4(B) shows the electrical circuit diagram of the equivalent circuit used for analysis. $R_T$ is the equivalent resistance and $X_T$ is the equivalent reactance of the tuning network.

The probe can be expressed in terms of an equivalent circuit (FIG. 4). The ratio of the power delivered to the inductor $L_1$ in the trap 21 to that deposited in the sample coil $L_S$ can be expressed as the ratio of the equivalent resistance $R_T$ of the tuning network to the sample coil resistance $R_S$:

$$P_T/P_S = R_T/R_S \quad [1]$$

As in most double tuned arrangements, there are compromises to be made between optimizing performance at a higher or lower frequency. At the higher frequency ($^1$H) the reactance of $C_2$ is much less than that of the trap 21 or sample coil $L_S$ so we can assume that only these two components, $L_S$ and trap 21, contribute to the total impedance. The impedance of the trap 21 can be calculated to be:

$$Z_T = [R_1 + iL_1\omega(1-\omega^2/\omega_1^2)]/(1-\omega^2/\omega_1^2)^2 + \text{terms in } R/Q \quad [2]$$

where $\omega_1$ has been defined as the resonant frequency of the trap 21. The equivalent resistance of the trap 21 is the real part of this expression and is shown in equation [3]:

$$R_T = R_1/(1-\omega^2/\omega_1^2)^2 \quad [3]$$

In the above expression, $\omega_1$ is a function of $L_1$, $C_1$, and $L_S$, since this circuit is used at the probe resonance. If $R_T$ can be expressed in terms of these quantities, conditions may be found for these components to minimize losses in the traps 21 at the higher frequency. The condition of resonance can be applied by setting the imaginary part of the trap impedance $X_T$ equal to the negative of the probe coil reactance as in equation [4]:

$$L_1\omega_0/(1-\omega_0^2/\omega_1^2) = L_S\omega_0 \quad [4]$$

where $\omega_0$ is the higher resonant frequency. This will allow the following simplification:

$$(1-\omega_0^2/\omega_1^2) = L_1/L_S \quad [5]$$

Inserting Eq. [5] into Eq. [3], $R_T$ can be expressed as:

$$R_T = R_1(L_S/L_1)^2 \quad [6]$$

If coils of all about the same Q are used, the ratio of the powers can be written as:

$$P_T/P_S = L_S/L_1 \quad [7]$$

where $L_1$ is assumed to be proportional to $R_1$ and $L_S$ is assumed to be proportional to $R_S$. Thus, in the case of the higher resonant frequency ($^1$H) the losses in the trap can be minimized by making $L_1$ relatively large compared to $L_S$.

In the case of the lower frequency ($^{31}$P), the series capacitor $C_2$ is the dominant term in the reactance of the tuning network at the lower resonance frequency. Thus, at this frequency we are on the inductive part of the trap resonance so the trap 21 "looks" as if it were an inductor. It then becomes evident that in order to minimize the losses in the trap 21 at the lower frequency ($^{31}$P), the inductor $L_1$ should be as small as possible; thus, its associated real resistance $R_1$ will also be minimized. This condition of a small inductor $L_1$ in the trap 21 also has the advantage of ensuring the reactance of the trap 21 will be much smaller than the reactance of $C_2$; thus tuning the lower resonance will be independent of the trap 21 tuning.

Figure 5:
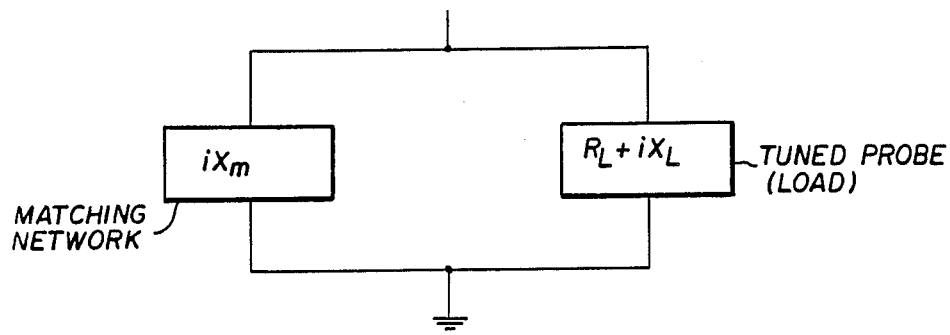
FIG. 5 shows a schematic diagram for matching a series tuned probe.

In general, to match a series tuned network to the generator impedance a reactive element is added in parallel such that the input impedance to the entire network has a real part equal to the generator impedance and no imaginary part (FIG. 5). The impedance of this network can be written as:

$$Z = 1/[1/iX_M + 1/(R+iX_L)] \quad [8]$$

where R is assumed to be equal to $R = \omega L/Q$. By assuming that this impedance must be real, $X_M$ may be written in terms of $X_L$ and R:

$$-X_M = (R^2 + X_L^2)/X_L \quad [9]$$

If the real part of the impedance of the probe is required to be matched to 50 ohms then we find:

$$(R^2 + X_L^2)/R = 50 \quad [10]$$

If R is assumed to be small, we may write:

$$X_L = (R*50)^{\frac{1}{2}} \text{ and} \quad [11]$$

$$X_M = -X_L \quad [12]$$

Figure 6:
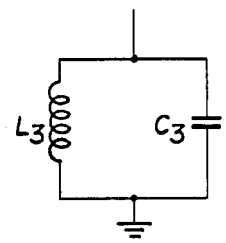
FIG. 6 shows the matching network for a two frequency match.

For most NMR probes R is of the order of one ohm so both $X_M$ and $X_L$ will be approximately seven ohms and opposite in sign. A convenient way to make $X_M$ equal to seven ohms at both $^{31}$P and $^1$H frequencies is to use the matching network of FIG. 6. At $^{31}$P frequency the reactance of $C_3$ is large enough so that only the inductor $L_3$ need be considered; its value may be adjusted to provide seven ohms of reactance at the $^{31}$P frequency. The capacitor $C_3$ can then be tuned so that the parallel combination of $C_3$ and $L_3$ has the required reactance.

Experiment 1

Figure 7A:
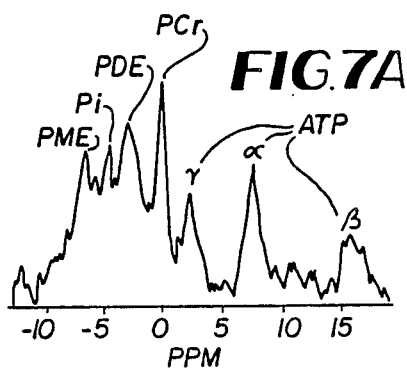
FIG. 7(A) illustrate the $^{31}P$ NMR spectra of a dog brain taken with a single tuned coil and FIG. 7(B) illustrates a similar response taken with the double tuned coil of the present invention. Both spectra represent four minutes of data accumulation, with a four second recycling time. For the $^{31}P$ spectra a pre-saturation pulse was applied 15 ppm downfield from NMR to saturate broad components from bone lipids.
Figure 7B:
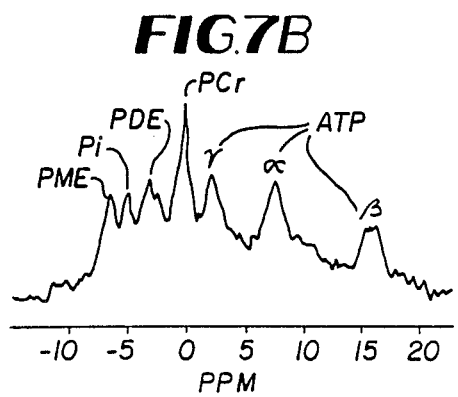
Figure 7C:
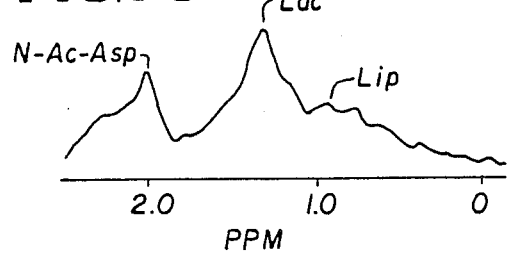
FIG. 7(C) illustrates the proton spectrum taken with the double-tuned arrangement and represents four minutes of data acquisition using the 1-3-3-1 pulse sequence for water suppression. This spectrum was resolution enhanced with line width stripping and gaussian apodization. The $^{31}P$ spectra are both control spectra and the 1H spectrum is during hypoxia.

A four cm diameter two-turn surface coil probe in the fashion described above with optimized operation at $^{31}$P frequency is used for spectroscopy. The nominal 90 degree pulse width of this double tuned coil at $^{31}$P was 35 microsec, compared with a 30 microsec 90 degree pulse width for the same coil used in a simple single tuned probe. FIG. 7 shows $^{31}$P and $^1$H spectra (in terms of parts per million of frequency change) of a dog brain taken with a double tuned coil (FIG. 7(B) and 7(C)), and a $^{31}$P spectrum taken with a single tuned probe (FIG. 7(A)) with identical parameters. The skin and muscle were reflected back off the skull to reduce their contributions to both $^1$H and $^{31}$P spectra.

These results demonstrate that a probe can be double-tuned as described without any appreciable loss in NMR performance at the $^{31}$P frequency and while maintaining adequate operation at $^1$H frequency. This probe contains only five reactive elements and is much simpler to construct than previously reported designs. It is important to note that, although only one embodiment has been treated in detail, there are at least four complementary configurations of the same components that will yield the same number of reasonances. These complementary configurations are shown in FIG. 8.

The reactance curve of FIG. 8B, as in FIG. 3B, has two resonant frequencies. This curve belongs to all probe configurations of FIG. 8A. As can be seen, the position of the circuit elements with respect to sample inductor $L_s$ does not change the fact that such circuits provide two resonant frequencies concurrently. In FIG. 8(A.1) trap $L_1$-$C_1$ is closer than capacitor $C_2$ to sample inductor $L_s$. FIG. 8(A.2) shows that the resonant circuit combination of $C_2$ and $L_1$-$C_1$ trap can be in parallel connection with sample inductor $L_s$, provided that matching impedance $X_m$ is now in series connection with sample inductor $L_s$. The circuits of FIGS. 8(A.1) and 8(A.2) can be further modified to those of FIGS. 8(A.3) and 8(A.4), respectively, by merging capacitor $C_2$ into trap $L_1$-$C_1$ in series with inductor $L_1$. Other circuits providing a multiple pole response are also possible. A transformer match is also useful where a broad-band match is required.

It must be understood that although all the aformentioned circuits generate two resonant frequencies, it is obvious to an ordinary person skilled in the art that each configuration will provide different resonant frequencies.

This method of tuning NMR probes can be extended very simply to more than two frequencies (multiple tuning). It can be shown that if more traps are added in series to the tuning network, a pole will be added to the reactance curve of the tuning network for each trap. This will result in a reasonance on the capacitive side of the pole for each additional trap (FIG. 9). Thus, a total of N resonances can be tuned for 2N−1 reactive components. However, as mentioned earlier, the above described multiple tuning probes do not accommodate closely spaced resonances quite well, resulting in somewhat reduced sensitivity at either one of two closely spaced nuclei (e.g. $^{31}$P and $^{23}$Na) and depending on how close the resonant frequency of two nuclei are (e.g. $^{19}$F and $^1$H), larger sacrifices in sensitivity at both reso-nances occur. Since there also exist many nuclei of interest that resonate at relatively closely spaced frequencies (Table 1), the utilization of a coupled tank must be such that it actually "splits" a resonance, to be ideal for closely spaced nuclei.

TABLE 1

| Nucleus | Resonant Frequency* (MHz) |
|---|---|
| $^1$H | 88.4 |
| $^{19}$F | 83.2 |
| $^{31}$P | 32.8 |
| $^{77}$Li | 34.4 |
| $^{23}$Na | 23.3 |

TABLE 1-continued

| Nucleus | Resonant Frequency* (MHz) |
|---|---|
| $^{13}$C | 22.2 |

*Resonant frequencies at 2.08 T.

Figure 10A:
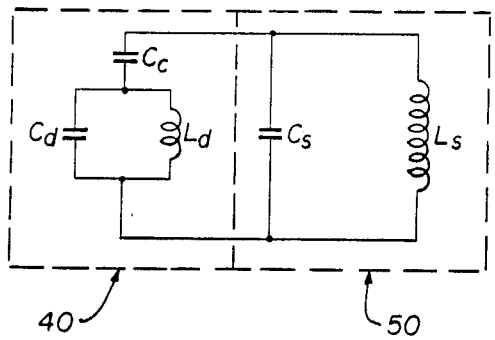
FIG. 10(A) is a "dummy" tank circuit capacitively coupled to the single-tuned probe. This will split the resonance into two resonances. $L_S$, and $C_d$ are the components of the dummy tank circuit and $C_c$ is the coupling capacitor.

Referring to FIG. 10A, the aforementioned coupling referred to as overcoupled tank, for the reason explained hereafter, can be achieved with the use of a coupling capacitor $C_c$.

In general three conditions of coupling exist: uncoupled, in which the resonances are partially separated: critically coupled, wherein the resonances are intimately next to each other: and overcoupled, the case which will yield two distinct resonances. It is, therefore, the latter that will be described in detail for the present invention.

In the case of capacitively coupled tank circuits, the coupling constant, K, is defined as:

$$K = C_c/(C_s C_d)^{\frac{1}{2}} \quad [13]$$

Where $C_c$ is the coupling capacitor, $C_d$ the capacitor in the "dummy" tank circuit 40 and $C_s$ is the capacitor in the sample coil tank circuit 50. The condition for over-coupling the two tank circuits is that $K^2 Q_1 Q_2 > 1$. Under these conditions the circuit will have two distinct resonances $\omega_0$ and $\omega_1$. The Q of each resonance is equal to:

$$Q = (Q_d Q_s)^{\frac{1}{2}} \quad [14]$$

Figure 10B:
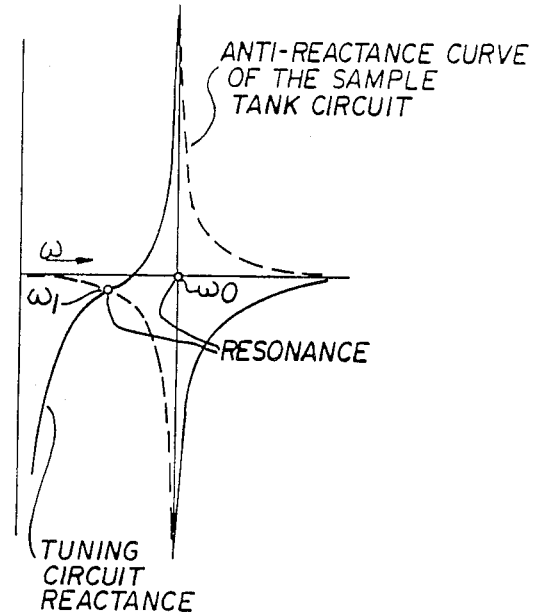
FIG. 10(B) is a graphical analysis of the impedance characteristics of overcoupled tank circuits. The dotted curve is the anti-reactance curve of the sample tank circuit and the solid curve is the reactance of the "tuning network" (in this case the coupling capacitor in series with the dummy tank circuit). The intersections of the 2 curves denote resonances. Note that both the dummy and sample tank circuit resonate at the same frequency.

The condition for these resonances is represented graphically at FIG. 10B.

Figure 11:
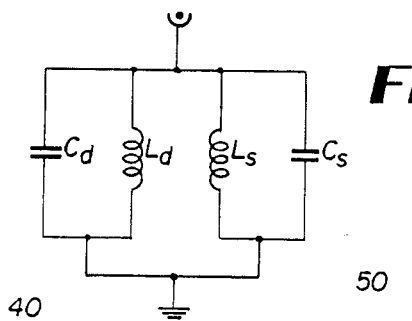
FIG. 11 shows an equivalent circuit for the higher resonance of the coupled network.

One resonance will be at $\omega = \omega_0$, where $\omega_0$ is the resonant frequency of each of the tank circuits 40 and 50. In this mode both tank circuits 40 and 50 are resonant and therefore have a very large impedance; thus, the impedance of $C_c$ can be ignored and in this mode the circuit appears as two resonant tank circuits 40, 50 in parallel (FIG. 11). Each tank circuit 40 and 50 will have the equivalent resistance:

$$R_{eq} = QL\omega_0 \quad [15]$$

Thus, the ratio of the power dissipated in the sample coil $L_s$ to that dissipated in the dummy inductor $L_d$ is:

$$P_s/P_d = Q_d L_d / Q_s L_s \quad [16]$$

The efficiency of the probe will be defined as the ratio of the current through the sample coil $L_s$ to that in the same coil in the absence of any coupling. This is equal to the square root of the ratio of the power dissipated in the sample coil $L_s$ to that in the same coil in the absence of any coupling. This is equal to the square root of the ratio of the power dissipated in the sample coil $L_s$ to that dissipated in the entire probe. Thus, in the parallel tank mode the efficiency of this probe is:

$$E = [1/(1 + Q_s L_s / Q_d L_d)]^{\frac{1}{2}} \quad [17]$$

In order to optimize this resonance $Q_d/Q_s$ and $L_d/L_s$ should be made large. Because the dummy coil $L_d$ is not loaded with a lossy sample, and because the geometry of the dummy coil $L_d$ is not limited by the sample, it is generally possible, for a given sample coil, to make a dummy coil which will be of significantly higher Q when the probe is loaded. The ratio of $Q_d/Q_s$ will depend on the geometry of the sample coil (i.e. how close it is to an optimal inductor) and the effect of sample loading. The ratio of the inductances can be adjusted arbitrarily, to make this resonance as efficient as required, but, this will degrade the efficiency of the other resonance.

Figure 12:
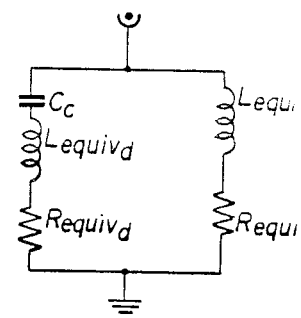
FIG. 12 illustrates an equivalent circuit for the lower resonance of the coupled network.

A second resonance is created at a frequency $\omega_1$ which is lower than $\omega_0$. A simplified equivalent circuit for this mode is shown in FIG. 12. At this resonance $\omega_1$, the circuit is operating on the inductive side of each tank circuit, and each tank can be represented as an inductor with the value:

$$L_{eq} = R/(1 - \omega^2/\omega_0^2) \quad [18]$$

in series with a resistor with a value:

$$R_{eq} = R/(1 - \omega^2/\omega_0^2) \quad [19]$$

where we assume $R = L \omega/Q$.

The resonance occurs at the frequency at which the equivalent dummy inductor $L_d$ and coupling capacitor $C_c$ series combination becomes enough to resonate the equivalent sample inductor $L_s$. The frequency of resonance $\omega_1$ is:

$$\omega_1 = \omega_0 / \{[(L_d + L_s)/(L_d L_s)^{\frac{1}{2}}]K + 1\}^{\frac{1}{2}} \quad [20]$$

In this mode the current in each of the equivalent inductors is the same, so that the ratio of power dissipated in the sample coil $L_s$ to that dissipated in the sample tank circuit 50 is the ratio of the equivalent resistance:

$$R_{eqs}/R_{eqd} = P_s/P_d = Q_d L_s/Q_s L_d \quad [21]$$

The efficiency of the probe in this mode is:

$$E = [1/(1 + L_d Q_s/L_s Q_d)]^{\frac{1}{2}} \quad [22]$$

Thus the lower resonance $\omega_1$ is also efficient if $Q_d/Q_s$ is made larger than 1. This resonance is also made more efficient if $L_s/L_d$ is greater than 1. The latter condition will degrade the performance of the probe at the higher resonance $\omega_0$.

Experiment 2

A 3 cm two turn surface coil double-tuned to $^{23}$Na (23.3 MHz) and $^{31}$P (35.8 MHz) with the method described above, using two $L_d/L_s$ ratios, was built for spectrocopy according to the present invention. The results were compared to the same coil single tuned to each frequency. The predicted and measured efficiencies are shown in table 2.

TABLE 2

| | $L_{da}/L_s = .8$ | | $L_{db}/L_s = 2.7$ | |
|---|---|---|---|---|
| | $E_{calc.}$ | $E_{measured}$ | $E_{calc}$ | $E_{measured}$ |
| $^{23}$Na | .80 | .82 | .70 | .72 |
| $^{31}$P | .80 | .79 | .95 | .94 |

Note: $Q_s = 110$(loaded), $Q_{da} = 200$ and $Q_{db} = 250$

Note that it is possible to make both resonances $\omega_0$, $\omega_1$ better than 80% efficient at the same time, and by changing the $L_d/L_s$ ratio either resonance can be optimized.

Figure 13A:
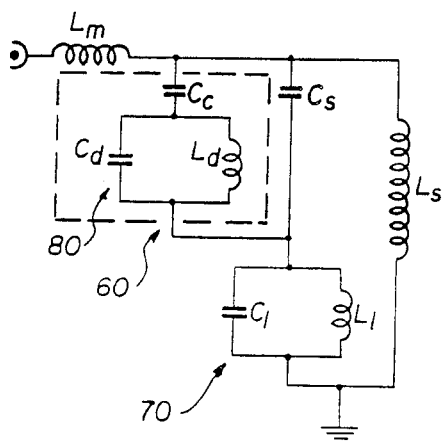
FIG. 13(A) schematically represents a $^{23}Na$, $^{31}P$, and $^1H$ NMR probe. This probe combines the "trap" double tuned design to tune a $^1H$ and $^{31}P$ NMR probe.
Figure 13B:
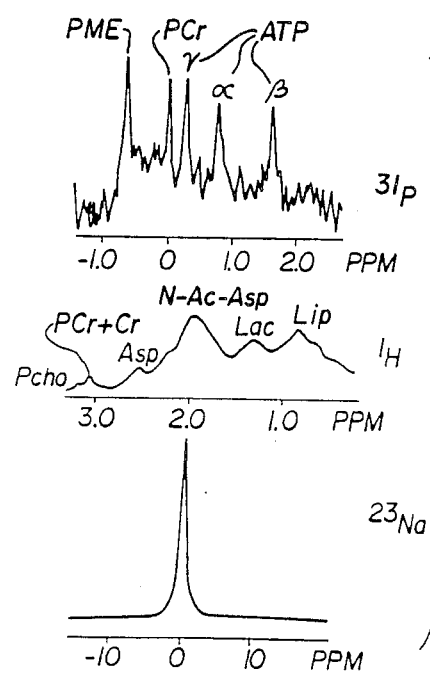
FIG. 13(B) is the concurrently acquired $^{23}Na$, $^{31}P$ and $^1H$ NMR spectra from a puppy brain invivo. The data were collected in 4 min with a 4 sec repetition time. The $^{31}P$ excitation pulse was preceded by a 500 ms. low power pulse 7 ppm down-field from PME to saturate broad resonances from bone and lipids. The 1-3-3-1 pulse sequence was used to obtain water suppression in the $^1H$ spectrum.

It is important to realize that this method of probe tuning is also useful in combination with other methods. A useful three nuclei ($^{23}$Ba, $^{31}$P, $^1$H) probe is created by combining a coupled tank circuit 60 with the $^1$H-$^{31}$P probe design 70, as explained earlier, (FIG. 13A). $L_1, C_1$ and $C_s$ form the tuning network used to double tune the sample tank circuit. $C_c$ is the coupling capacitor; $C_d$ and $L_d$ make up the dummy tank circuit 80. Since the dummy tank circuit 80 is tuned only to the $^{31}$P resonance of the sample tank circuit it will split this resonance into one for $^{23}$Na and one for $^{31}$P. At $^1$H frequency the dummy tank circuit 80 and coupling capacitor $C_c$ series combination acts like parallel capacitance to $C_s$, and thus has little effect on this resonance (the reactance of $C_s$ is relatively small compared to the $L_1$-$C_1$ parallel combination at $^1$H, and thus do not contribute much to the reactance of the tuning network at this frequency). Note, that if the coupling 60 was placed across $L_s$ instead of $C_s$, it would act as parallel capacitance to the $C_1$-$L_1$-$C_s$ tuning network and thus have a significant effect on the $^1$H resonance. Spectra of a puppy brain in vivo from all three nuclei are shown in FIG. 13B.

Although capacitive coupling does have the advantages of easy construction and independent tunability (resonance $\omega_0$ is independent of the coupling capacitor $C_c$ but $\omega_1$ can be adjusted by adjusting the coupling capacitor $C_c$), it is important to note that many other methods and circuit configurations of coupling tanks exist. Preliminary results indicate that some of these circuits such as the ones shown in FIG. 14 are useful to NMR probe design. On the right hand side of each circuit diagram its coupling constant K, is printed.

Figure 14A:
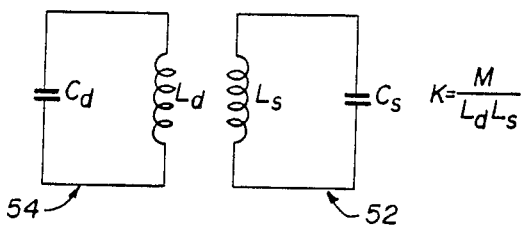
FIG. 14(A) is transformer coupled.

FIG. 14(A) shows the application of transformer $L_d$-$L_s$ wherein a sample capacitor $C_s$ is in parallel connection with $L_s$, and a capacitor $C_d$ is in parallel connection with $L_d$ to constitute the sample tank 52 and dummy tank 54, respectively. The calculated K for this circuit is $$K = M/L_d L_s \quad [23]$$

where M is the mutual inductance of transformer $L_d$-$L_s$.

Figure 14B:
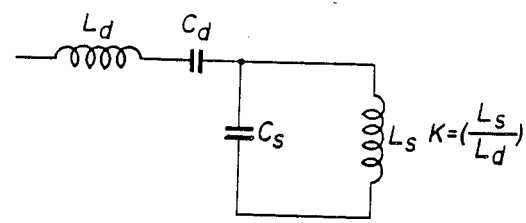
FIG. 14(B) is a seriesparallel coupled circuit.

FIG. 14(B) shows that instead of parallel dummy tank 40 of FIG. 11, we can use $C_d$ and $L_d$ in series connection whereby doing so the value of K is changed to:

$$K = (L_s/L_d) \quad [24]$$

Figure 14C:
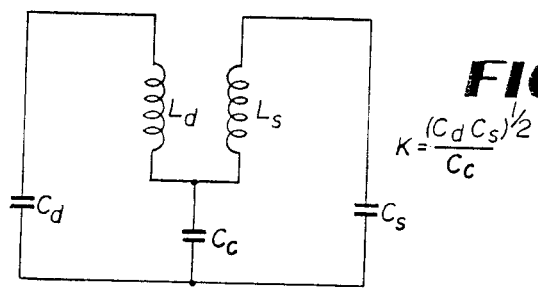
FIG. 14(C) is a capacitively coupled series resonant circuit.

The coupling constant of eq. (13) is inverted to $$K = [(C_d C_s)^{.5}]/C_c \quad [25]$$

by constructing the probe such as the one of FIG. 14(C) where both serial sample tank and serial dummy tank are in parallel with coupling capacitor $C_c$.

Figure 15:
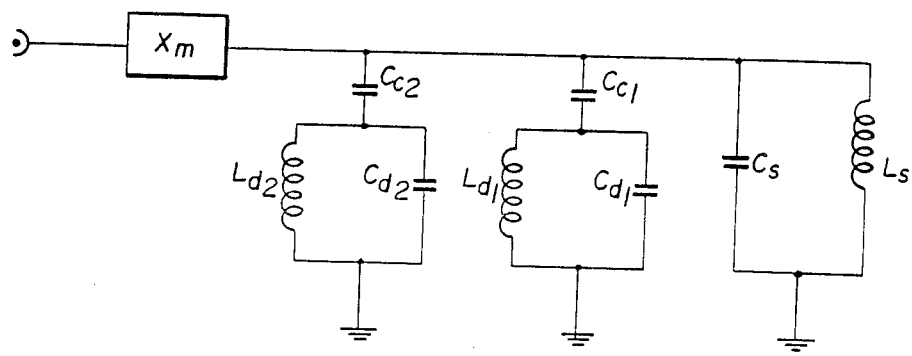
FIG. 15 shows a cascaded coupled NMR probe for $^{31}P$, $^{23}Na$ and $^{35}Cl$. The first dummy tank circuit ($d_1$) is tuned on resonance with the sample coil at $^{31}P$ frequency. The second dummy tank circuit ($d_2$) is tuned to the $^{23}Na$ resonance of the first coupled network to split it into a resonance at $^{23}Na$ and another at $^{35}Cl$. At $^{31}P$ frequency the second dummy tank circuit looks like a parallel capacitance to $C_s$.

Multi-nuclear probes can also be built by coupling into the sample tank circuit more than once. A circuit diagram of such a "cascaded coupled" probe tuned to $^{35}$Cl, $^{23}$Na and $^{31}$P is shown in FIG. 15.

These results demonstrate that overcoupled tank circuits can be used to multiple-tune NMR probes with high sensitivity. It is also versatile, and compatible with almost any other method of probe tuning; providing a way to enhance the multinuclear capability of an existing probe.

Hence, this method of probe tuning is quite versatile and should allow spectroscopists to tailor-make probes to suit their needs, such as simultaneous spectroscopy of various combinations of nuclei of different, substantially distinct or closely spaced, resonant frequencies.

The foregoing description of the specific embodiment(s) will so fully reveal the general nature of the invention that others can, by applying current knowledge, readily modify and/or adapt for various applications such specific embodiment(s) without departing from the generic concept, and, therefore, such adaptations and modifications should and are intended to be comprehended within the meaning and range of equivalents of the disclosed embodiment(s). It is to be understood that the phraseology or terminology employed herein is for the purpose of description and not of limitation.

What is claimed is:

1. An NMR probe having an electrical circuit including an alternating current power source, an RF coil driven by said power source, tuning circuit means connected to said RF coil for providing a plurality of resonance frequencies for said RF coil, said tuning circuit means having a transfer function, and a matching impedance means connected to said tuning circuit means for matching the impedance of said tuning circuit to the impedance of said power source,
wherein said RF coil of said probe is multiply-tuned to a plurality of NMR frequencies for concurrent study of nuclei in a sample as concurrently detected by said RF coil, said transfer function having a plurality of poles in accordance with said plurality of NMR frequencies.

2. A probe in accordance with claim 1, wherein said tuning circuit means comprises a first capacitor in series connection with at least one parallel L-C trap for providing at least two of said resonance frequencies of said probe, said resonance frequencies being significantly spaced, said parallel L-C trap comprising a first trap capacitor connected in parallel with a first trap inductor.

3. A probe in accordance with claim 1, wherein said turning circuit means comprises a first capacitor in parallel connection with a coupled L-C circuit for generating at least two significantly spaced ones of said resonance frequencies, said coupled L-C circuit comprising a second capacitor in a series connection with a further inductor.

4. A probe in accordance with claim 1, wherein said RF coil is in series connection with said tuning circuit means and in parallel connection with said matching impedance means.

5. A probe in accordance with claim 2, wherein said RF coil is in series connection with said tuning circuit means and in parallel connection with said matching impedance means.

6. A probe in accordance with claim 1, wherein said RF coil is in parallel connection with said tuning circuit means and in series connection with said matching impedance means.

7. A probe in accordance with claim 2, wherein said RF coil is in parallel connection with said turning circuit means and in series connection with said matching impedance means.

8. A probe in accordance with claim 1, further including a tank capacitor in parallel connection with said RF coil so as to form, in conjunction therewith, a sample tank circuit resonating at a first of said resonant frequencies.

9. A probe in accordance with claim 8, wherein said sample tank circuit is in parallel connection with said tuning circuit means, and said tuning circuit means comprises a combination of a respective coupling capacitor in series connection with a dummy L-C trap, for providing a second resonance frequency of said RF coil that is lower than, and substantially closely spaced to, said first resonance frequency, said dummy L-C trap comprising a respective inductor connected in parallel with a respective capacitor.

10. A probe in accordance with claim 8, further including two of said tuning circuit means in series connection with said capacitor of said sample tank circuit, the resonance frequency of said RF coil of said two tuning circuit means being substantially spaced from that of the first of said two tuning circuit means.

11. A probe in accordance with claim 1, wherein said transfer function of said tuning circuit means has more than two poles, each said pole being sufficiently separated from one another as to cause resonance of said RF coil at at least three distinct frequencies.

12. A multiply-tuned radio frequency probe for use in nuclear magnetic resonance (NMR) spectroscopy and imaging, comprising:
probe means for generating a radio-frequency pulse; and
circuit response means for creating a multiple pole circuit response in said probe means, each said pole being sufficiently separated from one another as to cause resonance of said probe means at distinct frequencies.

13. The probe of claim 3, wherein said RF coil is in series connection with said tuning circuit means and in parallel connection with said matching impedance means.

14. The probe of claim 3, wherein said RF coil is in parallel connection with said tuning circuit means and in series connection with said matching impedance means.

15. The probe of claim 8, wherein said sample tank circuit is transformer coupling to said tuning circuit means, said tuning circuit means comprising a respective inductance of the transformer and a respective capacitor.

16. The probe of claim 8, wherein said sample tank circuit is series coupled to said tuning circuit means, said tuning circuit means comprising a series connection of a respective capacitor and inductor.

17. The probe of claim 8, said tank circuit and said tuning circuit means comprising a capacitively coupled series resonant circuit, wherein a coupling capacitor is connected in series with said RF coil, said series connection of coupling capacitor and RF coil are connected in parallel with said tank capacitor, and a series connection of a dummy inductor and dummy capacitor are connected in parallel across said coupling capacitor.

18. The probe of claim 7, comprising further tuning means connected in parallel across said first capacitor connected in series with said L-C trap.

19. The probe of claim 18, said first capacitor and said RF coil comprising a tank circuit, and said tuning means having said first capacitor series connected with said L-C trap providing two of said resonant frequencies that are substantially spaced, and said further tuning means providing a substantially small splitting of the lower one of the two resonant frequencies of said two resonant frequencies.

* * * * *